United States Patent
Lee

(10) Patent No.: US 11,735,569 B2
(45) Date of Patent: Aug. 22, 2023

(54) LIGHT EMITTING DEVICE MODULE AND DISPLAY APPARATUS HAVING THE SAME

(71) Applicant: SEOUL VIOSYS CO., LTD., Gyeonggi-do (KR)

(72) Inventor: Chung Hoon Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 87 days.

(21) Appl. No.: 17/335,788

(22) Filed: Jun. 1, 2021

(65) Prior Publication Data

US 2021/0384172 A1 Dec. 9, 2021

Related U.S. Application Data

(60) Provisional application No. 63/178,210, filed on Apr. 22, 2021, provisional application No. 63/033,912, filed on Jun. 3, 2020.

(51) Int. Cl.
*H01L 25/075* (2006.01)
*H01L 25/13* (2006.01)
(Continued)

(52) U.S. Cl.
CPC ...... *H01L 25/0753* (2013.01); *H01L 25/0655* (2013.01); *H01L 25/105* (2013.01);
(Continued)

(58) Field of Classification Search
CPC ............. H01L 25/0753; H01L 25/0655; H01L 25/105; H01L 25/13; H01L 25/162; H01L 25/167; H01L 25/18; H01L 33/62; H01L 24/32; H01L 24/48; H01L 24/73; H01L 33/382; H01L 33/385; H01L 2224/32225; H01L 2224/48137; H01L 2224/48227; H01L 2224/73265; H01L 2924/12041; H01L 24/05; H01L 24/29; H01L 24/83; H01L 2224/48091; H01L 2224/49112; H01L 2224/83101; H01L 24/49; H01L 24/45; H01L 2224/04042;
(Continued)

(56) References Cited

U.S. PATENT DOCUMENTS 6,914,261 B2 7/2005 Ho
2014/0317975 A1 10/2014 Nall et al.
(Continued)

FOREIGN PATENT DOCUMENTS

KR 1020110115506 A 10/2011
KR 1020150009418 A 1/2015
KR 101841892 B1 3/2018

OTHER PUBLICATIONS

English translation of International Search Report for International Application No. PCT/KR2021/006872, dated Sep. 24, 2021, 4 pages.

*Primary Examiner* — Elias Ullah
(74) *Attorney, Agent, or Firm* — LaBatt, LLC

(57) ABSTRACT

A light emitting device module includes a substrate, a plurality of light emitting devices mounted on the substrate, an adhesive layer interposed between the substrate and the light emitting device; and bonding wires electrically connecting the plurality of light emitting devices. The substrate includes an outer electrode in at least a partial region, and the adhesive layer has a non-conductive material.

20 Claims, 7 Drawing Sheets

(51) Int. Cl.
*H01L 33/62* (2010.01)
*H01L 25/16* (2023.01)
*H01L 25/065* (2023.01)
*H01L 25/10* (2006.01)
*H01L 25/18* (2023.01)
*H01L 23/00* (2006.01)
*H01L 33/38* (2010.01)

(52) U.S. Cl.
CPC ............ *H01L 25/13* (2013.01); *H01L 25/162* (2013.01); *H01L 25/167* (2013.01); *H01L 25/18* (2013.01); *H01L 33/62* (2013.01); *H01L 24/32* (2013.01); *H01L 24/48* (2013.01); *H01L 24/73* (2013.01); *H01L 33/382* (2013.01); *H01L 33/385* (2013.01); *H01L 2224/32225* (2013.01); *H01L 2224/48137* (2013.01); *H01L 2224/48227* (2013.01); *H01L 2224/73265* (2013.01); *H01L 2924/12041* (2013.01)

(58) Field of Classification Search
CPC . H01L 2224/05554; H01L 2224/45139; H01L 2224/45144; H01L 2224/45147; H01L 2224/49107; H01L 2224/49109; H01L 2224/49113; H01L 2224/8385; H01L 2924/07802; H01L 2924/15311; H01L 2924/181
See application file for complete search history.

(56) References Cited

U.S. PATENT DOCUMENTS

| | | |
|---|---|---|
| 2020/0066691 A1 | 2/2020 | Chae et al. |
| 2020/0395510 A1 | 12/2020 | Bower et al. |
| 2021/0043618 A1* | 2/2021 | Bower .................... H01L 27/15 |

* cited by examiner

LIGHT EMITTING DEVICE MODULE AND DISPLAY APPARATUS HAVING THE SAME

CROSS-REFERENCE OF RELATED APPLICATIONS AND PRIORITY

The Present Application is a Non-provisional Application which claims priority to and the benefit of filing dates of U.S. Provisional Application Nos. 63/033,912 filed Jun. 3, 2020 and 63/178,210 filed Apr. 22, 2021, the disclosure of which are incorporated by reference in their entirety.

TECHNICAL FIELD

Exemplary embodiments relate to a light emitting device module and a display apparatus having the same.

BACKGROUND

Light emitting devices are semiconductor devices using light emitting diodes which are inorganic light sources, they are used in various technical fields such as display apparatuses, automobile lamps, general lighting, and the like, and these light emitting diodes have advantages such as longer lifespan, lower power consumption, and quicker response than conventional light sources, and thus, the light emitting diodes have been replacing the conventional light sources.

The conventional light emitting diodes have been generally used as backlight light sources in display apparatuses. However, display apparatuses that directly realize images using the light emitting diodes have been recently developed. Such displays are also referred to as micro LED displays.

In general, the display apparatus displays various colors through mixture of blue, green, and red light. In order to realize various images, the display apparatus includes a plurality of pixels, each including blue, green, and red sub-pixels. As such, a color of a certain pixel is typically determined based on colors of the sub-pixels, and images can be realized through a combination of such pixels.

In a case of the micro LED display, micro LEDs are arranged on a plane corresponding to each sub-pixel, and a large number of micro LEDs are mounted on one substrate. However, the micro LEDs have a very small size of 200 µm or less, further 100 µm or less, and various drawbacks in transferring the micro LEDs to a circuit board may occur.

SUMMARY

Exemplary embodiments provide a light emitting device module that facilitates transferring a light emitting device onto a substrate, and a display apparatus including the same.

A light emitting device module according to an exemplary embodiment may include a substrate, a plurality of light emitting devices mounted on the substrate, an adhesive layer interposed between the substrate and the light emitting device, and bonding wires electrically connecting the plurality of light emitting devices, in which the substrate may include an outer electrode in at least a partial region, and the adhesive layer may have a non-conductive material.

In at least one variant, the substrate may be formed of a non-conductive material.

In another variant, the light emitting devices may emit light of different wavelengths from one another. The light emitting devices may emit blue light, green light, or red light.

In further another variant, the light emitting device may include a first LED stack, a second LED stack, and a third LED stack, in which the first, second, and third LED stacks may emit red light, blue light, and green light, respectively.

In at least one variant, the substrate may include at least four outer electrodes.

In another variant, the light emitting devices may be arranged in a matrix form on the substrate.

In further another variant, the light emitting devices may be arranged in a zigzag form on the substrate.

In another variant, the bonding wire may electrically connect the light emitting device and the outer electrode. The bonding wire may be formed of a metallic material.

In further another variant, the substrate may include at least two outer electrodes. The outer electrode may include a first outer electrode and a second outer electrode, in which the first outer electrode may be disposed adjacent to and parallel to one side surface of the substrate, and the second outer electrode may face the first outer electrode and be disposed adjacent to another side surface of the substrate.

In another variant, the outer electrode may be formed passing through the substrate. In further another variant, the outer electrode may be formed to cover a side surface of the substrate.

In another variant, the light emitting device module may further include a molding layer formed to surround the light emitting devices.

A display apparatus according to an exemplary embodiment may include a panel substrate, and a plurality of light emitting device modules arranged on the panel substrate. Each of the light emitting device modules may include a substrate, a plurality of light emitting devices mounted on the substrate, an adhesive layer interposed between the substrate and the light emitting device, and bonding wires electrically connecting the plurality of light emitting devices. The substrate may include an outer electrode in at least a partial region, and the adhesive layer may have a first non-conductive material.

In at least one variant, the substrate may be formed of a second non-conductive material.

In another variant, the bonding wire may electrically connect one or more light emitting devices and the outer electrode.

In further another variant, the bonding wire may be formed of a conductive material.

In another variant, the light emitting device module may include at least two outer electrodes on the substrate.

According to exemplary embodiments of the present disclosure, it is possible to provide a light emitting device module that facilitates transferring a light emitting device onto a substrate, and a display apparatus including the same.

DETAILED DESCRIPTION

Figure 1A:
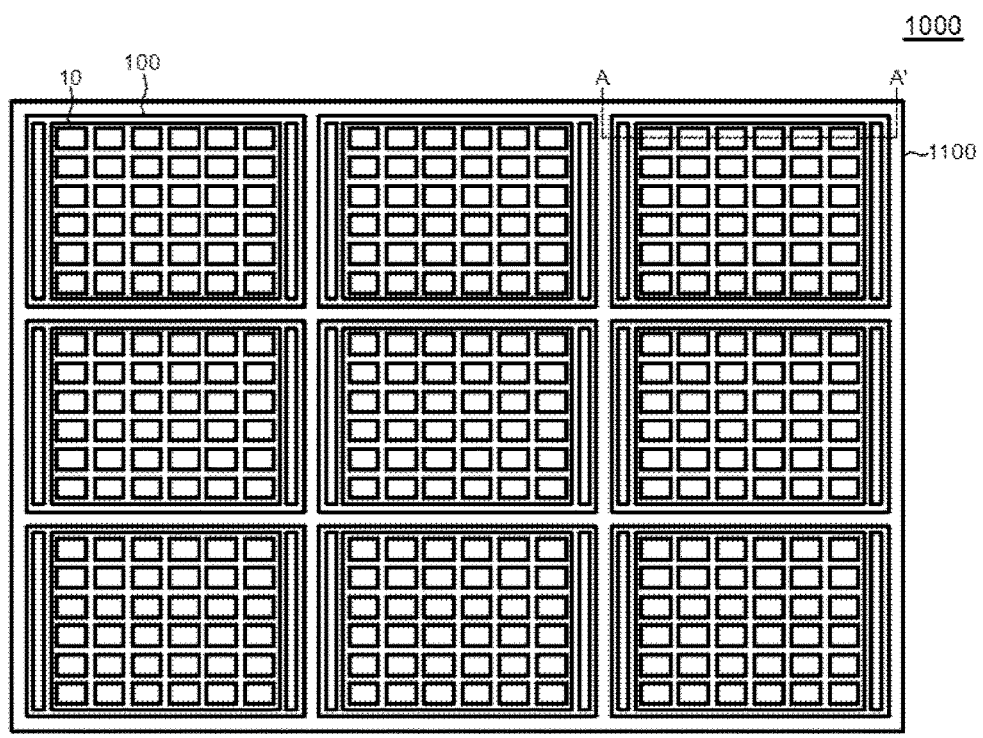
FIG. 1A is a schematic plan view illustrating a display apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 1B:
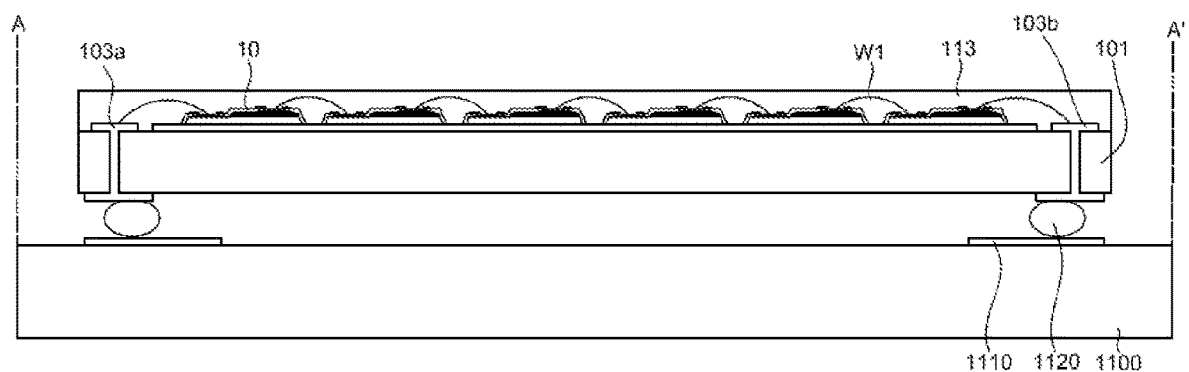
FIG. 1B is a schematic cross-sectional view taken along line A-A' of FIG. 1A.

FIGS. 1A and 1B are a plan view and a cross-sectional view of a display apparatus 1000, respectively, which illustrate a state in which a plurality of light emitting devices 10 is arranged in a matrix form according to an exemplary embodiment.

Referring to FIGS. 1A and 1B, the display apparatus 1000 includes a panel substrate 1100 and a plurality of light emitting device modules 100. The plurality of light emitting device modules 100 may include a substrate 101, the plurality of light emitting devices 10 mounted on the substrate 101, and a molding layer 113.

In some forms, the panel substrate 1100 may be formed of a material such as polyimide (PI), FR4, or glass, and may include a circuit for passive matrix driving or active matrix driving. According to an exemplary embodiment, the panel substrate 1100 may include wirings and resistors therein. In another exemplary embodiment, the panel substrate 1100 may include wirings, transistors, and capacitors. In addition, the panel substrate 1100 may have pads 1110 electrically connected to a circuit on an upper surface thereof. A bonding agent 1120 may be interposed between the pad 1110 on the upper surface of the panel substrate 1100 and the substrate 101, and the panel substrate 1100 and the substrate 101 may be bonded to each other by using the bonding agent 1120. The bonding agent 1120 may be a solder ball, and the substrate 101 may be bonded through a ball grid array (BGA). However, the inventive concepts are not limited thereto, and may be connected by soldering, epoxy bonding, anisotropic conductive film (ACF) bonding, and the like.

Outer electrodes 103a and 103b may be bonded to the panel substrate 1100 by the bonding agent 1120. More particularly, the pad 1110 on the panel substrate 1100 and the first and second outer electrodes 103a and 103b may be bonded in contact with the bonding agent 1120.

The plurality of light emitting device modules 100 may be arranged on the panel substrate 1100. The plurality of light emitting device modules 100 may be arranged in a matrix form on the panel substrate 1100. The plurality of light emitting device modules 100 may be arranged in 3×3 as shown in FIG. 1A, but the inventive concepts are not limited thereto, and may be arranged in various matrices such as 2×2, 4×4, and 5×5 (n×m, n=1, 2, 3, 4, . . . , m=1, 2, 3, 4, . . . .

Each of the light emitting device modules 100 may include the substrate 101 and the plurality of light emitting devices 10 arranged on the substrate 101. In addition, the light emitting device modules 100 may further include a molding layer 113 disposed surrounding the plurality of light emitting devices 10, as shown in FIG. 1B.

Hereinafter, each component of the display apparatus 1000 will be described in detail in the order of the light emitting device module 100 arranged in the display apparatus 1000 and the plurality of light emitting devices 10 arranged in the light emitting device module 100.

Figure 2A:
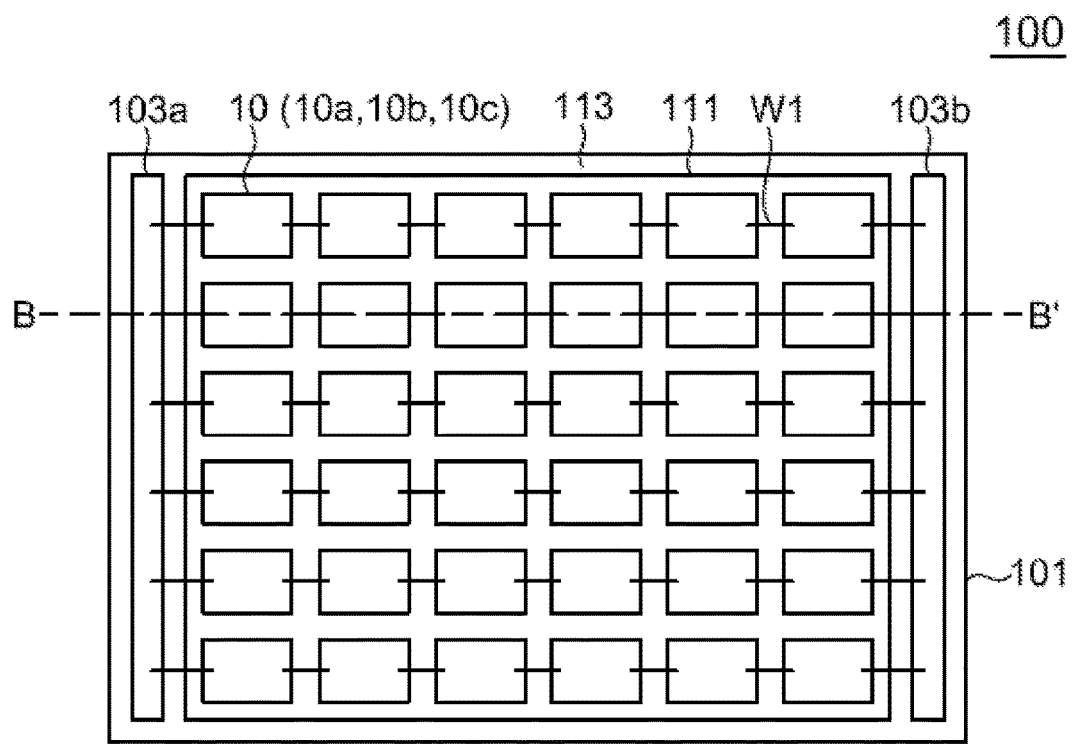
FIG. 2A is a schematic plan view illustrating a light emitting device module according to an exemplary embodiment.
Figure 2B:
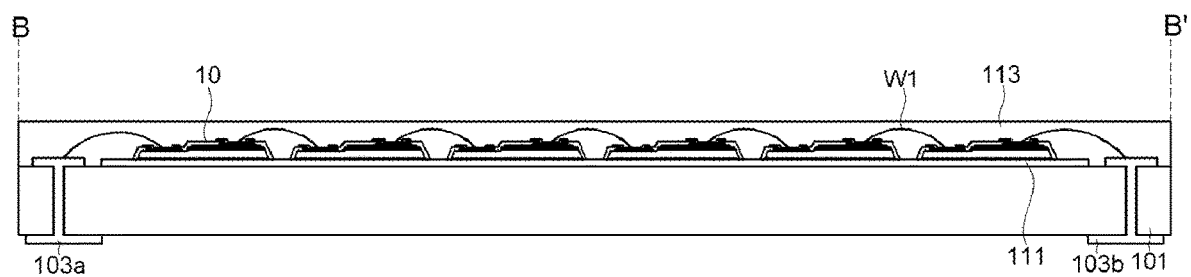
FIG. 2B is a schematic cross-sectional view taken along line B-B' of FIG. 2A.
Figure 2C:
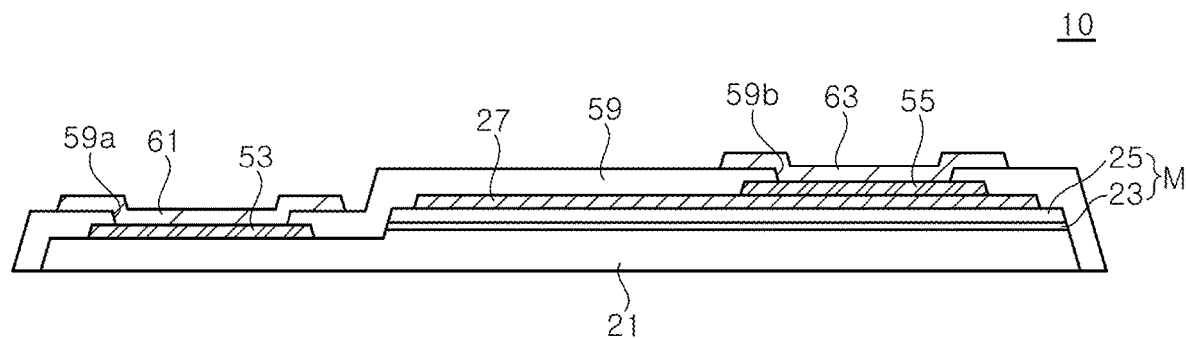
FIG. 2C is a schematic cross-sectional view illustrating one light emitting device according to an exemplary embodiment.

FIG. 2A is a schematic plan view illustrating a single light emitting device module 100 according to an exemplary embodiment, FIG. 2B is a schematic cross-sectional view taken along line B-B' of FIG. 2A, and FIG. 2C is a schematic cross-sectional view illustrating a single light emitting device 10 according to an exemplary embodiment.

Referring to FIGS. 2A, 2B and 2C, each of the light emitting device modules 100 may include a substrate 101, outer electrodes 103a and 103b, a plurality of light emitting devices 10 arranged on the substrate 101, and an adhesive layer 111, a bonding wire W1 between the light emitting devices 10, and a molding layer 113.

The substrate 101 may be a non-conductive substrate, and may be, for example, a PET, glass substrate, quartz, polymer, silicon (Si), GaAs, and sapphire substrate. In addition, the substrate 101 may be a black substrate 101 suitable for a display apparatus, but the inventive concepts are not limited thereto.

The substrate 101 may include the outer electrodes 103a and 103b at an edge of the substrate 101 to electrically connect the panel substrate 1100 and the plurality of light emitting devices 10. In addition, the outer electrodes 103a and 103b may have pads exposed on a surface thereof, and the outer electrodes 103a and 103b may include a via passing through the substrate 101. However, the inventive concepts are not limited thereto, and in another exemplary embodiment, the outer electrodes 103a and 103b may be formed to cover a side surface of the substrate 101 in place of the via.

The outer electrodes 103a and 103b may be electrically connected to the plurality of light emitting devices 10. More particularly, the outer electrodes 103a and 103b may include a first outer electrode 103a and a second outer electrode 103b. The first outer electrode 103a may be connected to at least one electrode of the light emitting device 10, for example, an anode electrode of the light emitting device 10. The second outer electrode 103b may be connected to at least one electrode of the light emitting device 10, for example, a cathode electrode of the light emitting device 10.

In an exemplary embodiment, the first outer electrode 103*a* may be disposed facing one side of the plurality of light emitting devices 10, and the second outer electrode 103*b* may be disposed opposite to the outer electrode 103*a*. In addition, the first and second outer electrodes 103*a* and 103*b* may be disposed in parallel to one side surface and another side surface of the substrate 101, respectively, to form a lengthy square shape, but the inventive concepts are not limited thereto, and the shape of the outer electrode may not be limited.

In an exemplary embodiment, it is described that the outer electrodes 103*a* and 103*b* may include two, but the inventive concepts are not limited thereto. In some exemplary embodiments, the outer electrodes may be formed near four edges of the substrate 101, respectively, and may include at least two or more outer electrodes.

The first and second outer electrodes 103*a* and 103*b* may be disposed to supply power to the plurality of light emitting devices 10, and may be formed as a common anode electrode and a common cathode electrode to be electrically interconnected with the plurality of light emitting devices 10. For example, a single first outer electrode 103*a* may be commonly connected to anode electrodes of the plurality of light emitting devices 10, and a single second outer electrode 103*b* may be commonly connected to cathode electrodes of the plurality of light emitting devices 10. However, the inventive concepts are not limited thereto, and in another exemplary embodiment, the light emitting devices 10 may be individually driven by separately connecting the outer electrodes 103*a* and 103*b* for each of the light emitting devices 10. In addition, the light emitting device module 100 may further include a control unit for controlling the light emitting devices 10. The control unit may control driving of the plurality of light emitting devices 10.

The first and second outer electrodes 103*a* and 103*b* may be formed of a conductive material, and for example, may be formed of a metallic material such as copper (Cu), gold (Au), silver (Ag), aluminum (Al), nickel (Ni), or the like.

The plurality of light emitting devices 10 may be arranged in 6×6 as shown in FIG. 2A, but the inventive concepts are not limited thereto, and in some exemplary embodiments, may be arranged in various matrices, or may be alternately arranged. The plurality of light emitting devices 10 may include light emitting devices 10 arranged in 6×6 on a same plane on the substrate 101, but the inventive concepts are not limited thereto. The plurality of light emitting devices 10 may include at least three light emitting devices 10.

Each of the plurality of light emitting devices 10 may emit red light, green light, and blue light. For example, the plurality of light emitting devices 10 arranged in a first row may sequentially emit red light, green light, and blue light, respectively, but the inventive concepts are not limited thereto. For example, the light emitting devices in each row may emit light of the same color. For example, the light emitting devices in the first row may emit red light, the light emitting devices in the second row emit green light, and the light emitting devices in the third row may emit blue light.

In another exemplary embodiment, the light emitting device 10 may include a first LED stack, a second LED stack, and a third LED stack in which one pixel is stacked in a vertical direction, respectively. Accordingly, one light emitting device 10 may constitute one pixel capable of emitting red light, green light, and blue light.

The light emitting device 10 may have a rectangular shape having a long axis and a short axis in plan view. For example, a length of the long axis may have a size of 100 μm or less, and a length of the short axis may have a size of 70 μm or less. The plurality of light emitting devices 10 may have a substantially similar shape and size.

Figure 2D:
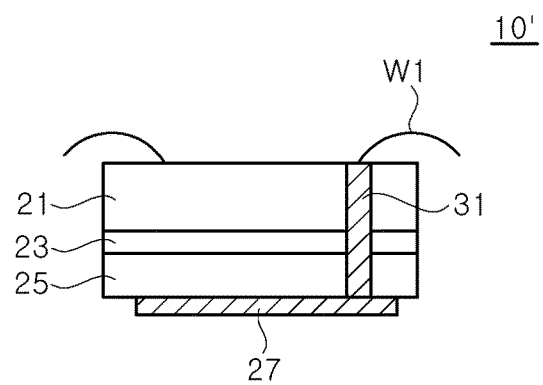
FIG. 2D is a schematic cross-sectional view illustrating one light emitting device according to another exemplary embodiment.

As shown in FIG. 2D, a light emitting structure, that is, a first conductivity type semiconductor layer 21, an active layer 23, and a second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. A growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In an exemplary embodiment, in a case of a light emitting device 10*a* emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of a light emitting device 10*b* emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in a case of a light emitting device 10*c* emitting blue light, the semiconductor layers may include gallium nitride (GaN), indium gallium nitride (InGaN), or zinc selenide (ZnSe).

The first conductivity type and the second conductivity type have opposite polarities, when the first conductivity type is an n-type, the second conductivity type becomes a p-type, or, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In the case of the light emitting device 10*b* or 10*c* emitting green or blue light, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in the drawings, these layers may be multiple layers, and may also include a superlattice layer. The active layer 23 may include a single quantum well structure or a multiple quantum well structure, and a composition ratio of a compound semiconductor may be adjusted to emit a desired wavelength. For example, the active layer 23 may emit blue light, green light, red light, or ultraviolet light.

As shown in FIG. 2C, the second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 2C. The mesa M may be disposed on the portion of the first conductivity type semiconductor layer 21, and an upper surface of the first conductivity type semiconductor layer 21 may be exposed around the mesa M.

In the illustrated exemplary embodiment, the mesa M is formed to expose the first conductivity type semiconductor layer 21 around it. In another exemplary embodiment, a through hole may be formed passing through the mesa M to expose the first conductivity type semiconductor layer 21.

In an exemplary embodiment, the first conductivity type semiconductor layer 21 may have a flat light exiting surface. In another exemplary embodiment, the first conductivity type semiconductor layer 21 may have a concave-convex pattern by surface texturing on a side of the light exiting surface. Surface texturing may be carried out, for example, by patterning using a dry or wet etching process. For example, cone-shaped protrusions may be formed on the light exiting surface of the first conductivity type semiconductor layer 21, a height of the cone may be about 2 μm to 3 μm, a distance between the cones may be about 1.5 μm to 2 μm and a diameter of a bottom of the cone may be about 3 μm to 5 μm. The cone may also be truncated, in which an upper diameter of the cone may be about 2 μm to 3 μm.

By forming the concave-convex pattern on the surface of the first conductivity type semiconductor layer 21, it is possible to increase light extraction efficiency by reducing total internal reflection. Surface texturing may be carried out on the first conductivity type semiconductor layers of all of the light emitting devices 10 (10a, 10b, and 10c), and accordingly, viewing angles of light emitted from the light emitting devices 10 (10a, 10b, and 10c) may be set to be uniform. However, the inventive concepts are not limited thereto, and at least one of the light emitting devices 10 (10a, 10b, and 10c) may have a flat surface without including the concave-convex pattern.

As shown in FIGS. 2C and 2D, an ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide layer or a metallic layer. For example, the transparent conductive oxide layer may include ITO, ZnO, or the like, and the metallic layer may include a metal such as Al, Ti, Cr, Ni, Au, or the like and alloys thereof.

A first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. The first contact pad 53 may be omitted.

A second contact pad 55 may be disposed on the ohmic contact layer 27. The second contact pad 55 is electrically connected to the ohmic contact layer 27. The second contact pad 55 may be omitted.

An insulation layer 59 covers the mesa M, the ohmic contact layer 27, the first contact pad 53, and the second contact pad 55. The insulation layer 59 has openings 59a and 59b exposing the first and second contact pads 53 and 55. The insulation layer 59 may be formed as a single layer or multiple layers.

A first electrode pad 61 and a second electrode pad 63 are disposed on the insulation layer 59. The first electrode pad 61 may extend from an upper portion of the first contact pad 53 to an upper portion of the mesa M, and the second electrode pad 63 may be disposed in an upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like and alloys thereof may be used. For example, the first and second electrode pads 61 and 63 may include a Ti layer or a Cr layer on an uppermost portion thereof and may include an Au layer thereunder.

Although the light emitting device 10 according to an exemplary embodiment has been briefly described with FIG. 2C, the light emitting device 10 may further include a layer having an additional function in addition to the above-described layer. For example, various layers such as a reflection layer to reflect light, an additional insulation layer to insulate a particular element, and an anti-solder layer to prevent diffusion of solder may be further included.

In addition, the mesa may be formed in various shapes, and locations and shapes of the first and second electrode pads 61 and 63 may also be variously modified. Moreover, the ohmic contact layer 27 may be omitted, and the second contact pad 55 or the second electrode pad 63 may directly contact the second conductivity type semiconductor layer 25.

In the illustrated exemplary embodiment, bonding wires W1 may be coupled to the first and second electrode pads 61 and 63. The bonding wires W1 may be bonded to the first and second electrode pads 61 and 63 on a side of the second conductivity type semiconductor layer 25. However, the inventive concepts are not limited thereto, and the bonding wires W1 may be bonded on a side of the first conductivity type semiconductor layer 21.

FIG. 2D is a schematic cross-sectional view illustrating a light emitting device 10' according to another exemplary embodiment.

Referring to FIG. 2D, the light emitting device 10' includes a first conductivity type semiconductor layer 21, an active layer 23, a second conductivity type semiconductor layer 25, an ohmic contact layer 27, and a via 31. The first conductivity type semiconductor layer 21, the active layer 23, and the second conductivity type semiconductor layer 25 may be grown on a growth substrate. The growth substrate may be removed from the first conductivity type semiconductor layer 21 using a technique such as laser lift off, chemical lift off, or the like. Accordingly, an upper surface of the first conductivity type semiconductor layer 21 is exposed. The ohmic contact layer 27 may be disposed on the second conductivity type semiconductor layer 25, and the via 31 electrically connected to the ohmic contact layer 2 may be formed through the first conductivity type semiconductor layer 21, the active layer 23, and the second conductivity type semiconductor layer 25, The via 31 may be electrically insulated from the first conductivity type semiconductor layer 21 and the active layer 23, and an insulation layer may be formed in a via hole for this purpose.

Bonding wires W1 may be bonded to the first conductivity type semiconductor layer 21 and the via 31 exposed by removal of the growth substrate. A first contact pad 53 or a first electrode pad 61 may be formed on the first conductivity type semiconductor layer 21 to connect the bonding wires W1.

Figure 2E:
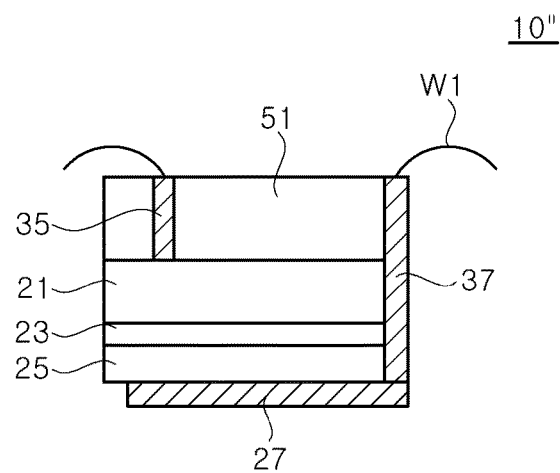
FIG. 2E is a schematic cross-sectional view illustrating one light emitting device according to further another exemplary embodiment.

FIG. 2E is a schematic cross-sectional view illustrating a light emitting device 10" according to another exemplary embodiment. In the exemplary embodiment described with reference to FIG. 2D, the growth substrate is removed, but in this exemplary embodiment, a growth substrate 51 remains. Meanwhile, a via 35 may pass through the growth substrate 51 to be electrically connected to a first conductivity type semiconductor layer 21. Meanwhile, a side electrode 37 may be electrically connected to an ohmic contact layer 27 along a side surface of the growth substrate 51. The side electrode 37 is electrically insulated from the first conductivity type semiconductor layer 21 and an active layer 23, and for this purpose, an insulation layer may be formed along the side surfaces of the growth substrate 51, the first conductivity type semiconductor layer 21, and the active layer 23. Bonding wires W1 may be electrically connected to the first conductivity type semiconductor layer 21 and a second conductivity type semiconductor layer 25 on a side of the first conductivity type semiconductor layer 21 through the via 35 and the side electrode 37.

Instead of the via 35, a side electrode electrically connected to the first conductivity type semiconductor layer 21 may be formed on the side surface of the growth substrate 51. In addition, instead of the side electrode 37, a via electrically connected to the ohmic contact layer 27 may be formed through the growth substrate 51, the first conductivity type semiconductor layer 21, the active layer 23, and the second conductivity type semiconductor layer 25.

As shown in FIGS. 2A and 2B, the adhesive layer 111 may be interposed between the substrate 101 and the plurality of light emitting devices 10. The light emitting devices 10 may be arranged on the substrate 101 through the adhesive layer 111. The adhesive layer 111 may be formed to have a width wider than those of the plurality of light emitting devices 10 arranged on the upper surface of the substrate 101. In addition, the adhesive layer 111 may be spaced apart from the first and second outer electrodes 103a and 103b.

The adhesive layer 111 may include a non-conductive material. For example, the non-conductive material may be an adhesive paste, an adhesive, a film, or the like. In the illustrated exemplary embodiment, the adhesive layer 111 is formed by coating a non-conductive adhesive paste, but the inventive concepts are not limited thereto.

The bonding wires W1 may electrically connect the plurality of light emitting devices 10. For example, the bonding wire W1 may connect an n-type electrode of the light emitting device 10 and a p-type electrode of the light emitting device 10 adjacent to the light emitting device 10. In this manner, the bonding wire W1 may electrically connect at least two or more of the plurality of light emitting devices 10. In addition, the bonding wires W1 may be formed on the first and second outer electrodes 103a and 103b for supplying power and on the light emitting devices 10 adjacent to the first and second outer electrodes 103a and 103b, respectively, to supply power. The bonding wires W1 may be formed to have as short a length as possible between locations being bonded, respectively, and thus, optical interference caused by the bonding wires W1 may be reduced or avoided.

The bonding wire W1 may be bonded by pressing the wire down from a top at the location where the wire is bonded. The bonding wire W1 may include a conductive material, and may be formed of a metallic material having favorable conductivity. For example, the bonding wire W1 may be formed of a single metal such as Au, Ag, Cu, or the like or an alloy thereof.

Meanwhile, in the illustrated exemplary embodiment, the bonding wire W1 is formed as a metal wiring for electrically connecting the plurality of light emitting devices 10, but the inventive concepts are not limited thereto, and may be formed through an air bridge process.

A molding layer 113 surrounding the plurality of light emitting devices 10 may be disposed on the substrate 101. A side surface of the molding layer 113 may be formed on a same axis as a side surface of the substrate 101. Accordingly, a width of the molding layer 113 and that of the substrate 101 may be formed to be the same. The molding layer 113 may be formed to cover the bonding wire W1 and may be formed higher than a maximum height of the bonding wire W1. As such, the molding layer 113 may prevent the light emitting device 10 and the bonding wire W1 from being damaged by an external impact, and may prevent moisture permeation, thereby improving reliability of the light emitting device module 100.

In the present disclosure, the molding layer 113 is formed as a single layer, but the inventive concepts are not limited thereto, and may be formed as a plurality of layers. The molding layer 113 may include an acrylic resin, a silicone resin, or a urethane resin. The molding layer 113 may further include a light absorbing agent or a dye. The molding layer 113 may be transparent, and may be black, white and gray. For example, when the molding layer 113 is formed of a black molding layer, a color difference due to the substrate 101 may be improved to improve uniformity of extracted light. In addition, since the molding layer 113 surrounds the plurality of light emitting devices 10 and may block light extracted to the side, a left and right viewing angle may be reduced, and it is possible to prevent a boundary line between adjacent pixels from being visible. In addition, an additional molding layer may be further included to prevent a boundary line between a plurality of light emitting device modules disposed on the panel substrate 1100 from being visible.

In the following exemplary embodiments, differences from the above-described exemplary embodiments will be mainly described in order to avoid repeated descriptions, and the same components will be briefly described or omitted.

Figure 3:
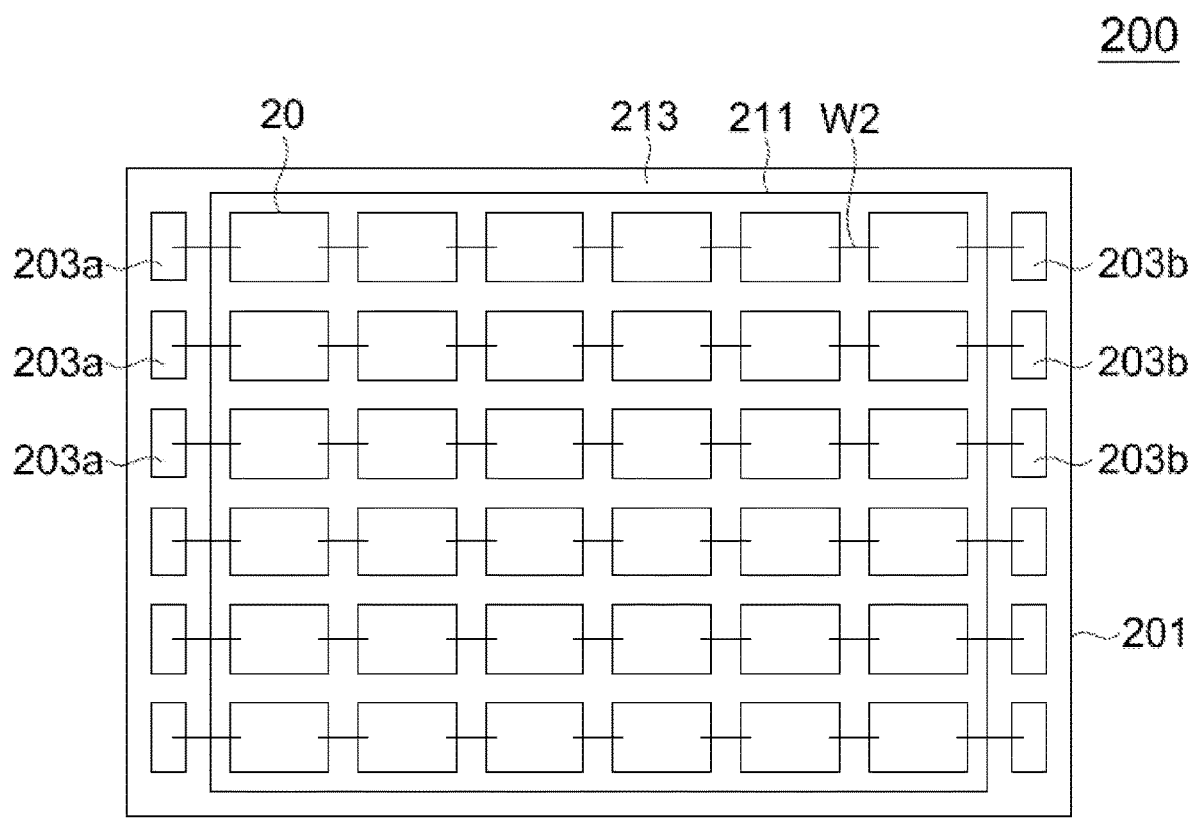
FIG. 3 is a schematic plan view illustrating a light emitting device module according to another exemplary embodiment.

FIG. 3 is a schematic plan view illustrating a light emitting device module 200 according to another exemplary embodiment.

Referring to FIG. 3, the light emitting device module 200 may be formed in the same manner as in FIG. 2A except for first and second outer electrodes 203a and 203b.

In an exemplary embodiment of the present disclosure, light emitting devices 20 may be arranged in a 6×6 matrix. The first and second outer electrodes 203a and 203b may be spaced apart from the light emitting devices 20 and formed to be in flush with the light emitting devices 20 located at both ends of each row so as to supply power to the plurality of light emitting devices 20. Accordingly, in the illustrated exemplary embodiment, the first and second outer electrodes 203a and 203b may include at least 12 outer electrodes. Specifically, the first outer electrode 203a may include six outer electrodes, and the second outer electrode 203b may also include six outer electrodes. However, the inventive concepts are not limited thereto, and the number and arrangement of the outer electrodes may be determined depending on an arrangement and use of the light emitting device 20.

In the illustrated exemplary embodiment, the light emitting devices 20 arranged in a first row may emit red light, the light emitting devices 20 arranged in a second row may emit green light, and the light emitting devices 20 arranged in a third row may emit blue light, but the inventive concepts are not limited thereto.

Figure 4:
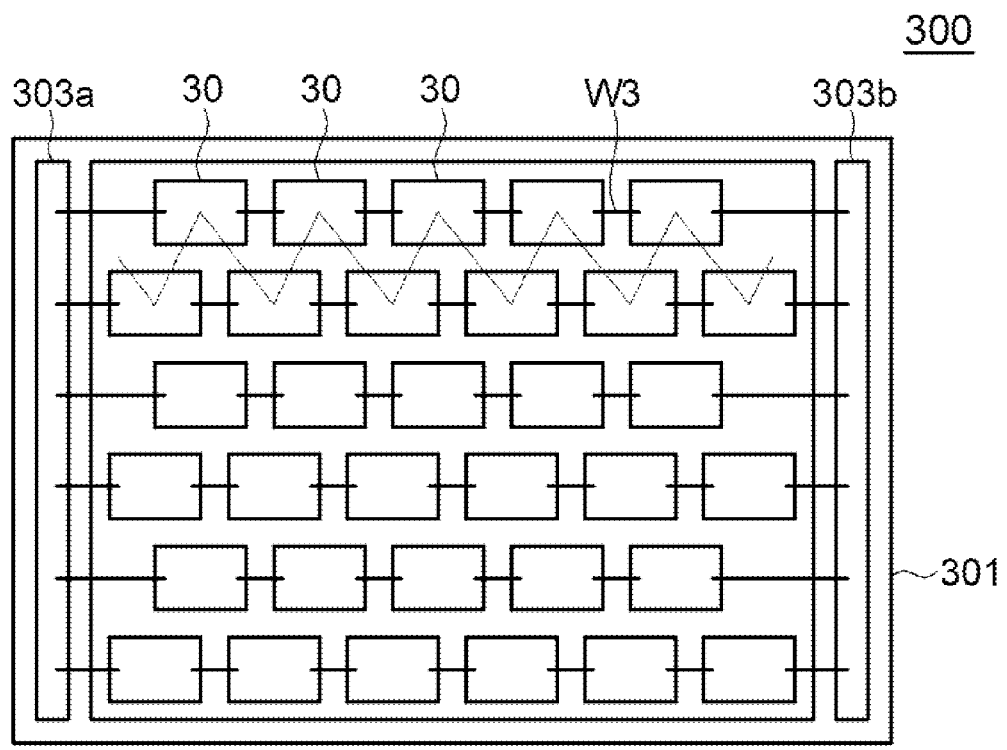
FIG. 4 is a schematic plan view illustrating a light emitting device module according to another exemplary embodiment.

FIG. 4 is a schematic plan view illustrating a light emitting device module 300 according to another exemplary embodiment.

Referring to FIG. 4, the light emitting device module 300 may be formed in the same manner as in FIG. 2A except for arrangements of light emitting devices 30. A plurality of light emitting devices 30 may be arranged in 6 rows from one side of a substrate 301 to the opposite side thereof, and the light emitting devices 30 in each two adjacent rows may be arranged in a zigzag manner. The plurality of light emitting devices 30 may be electrically connected through bonding wires W3, and thus, the arrangements of the plurality of light emitting devices 30 may not be restricted by electrical connection.

Figure 5A:
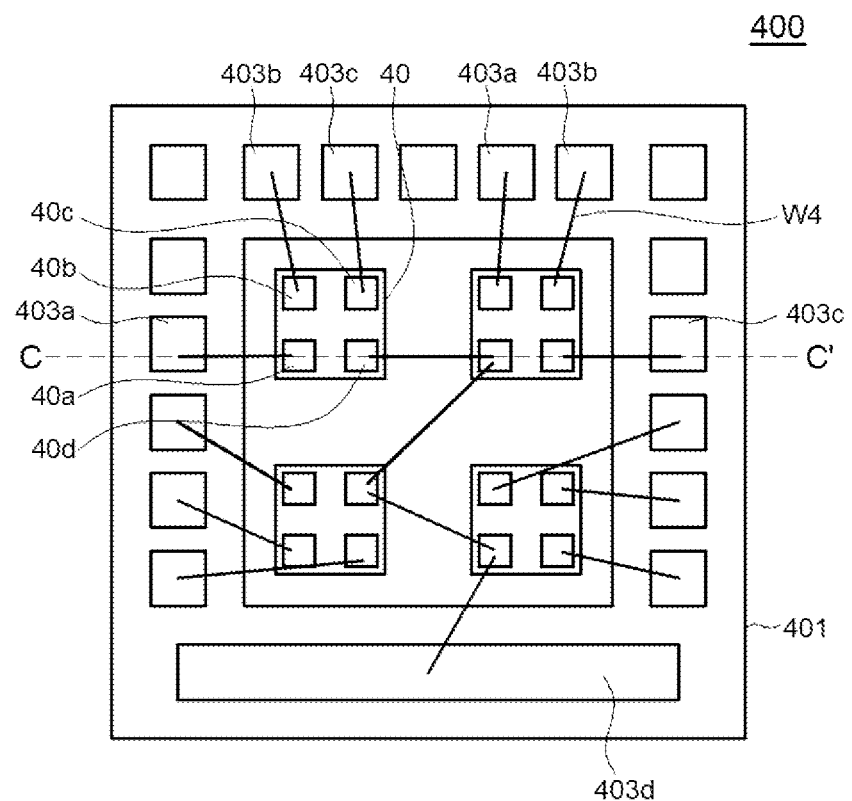
FIG. 5A is a schematic plan view illustrating a light emitting device module according to another exemplary embodiment.
Figure 5B:
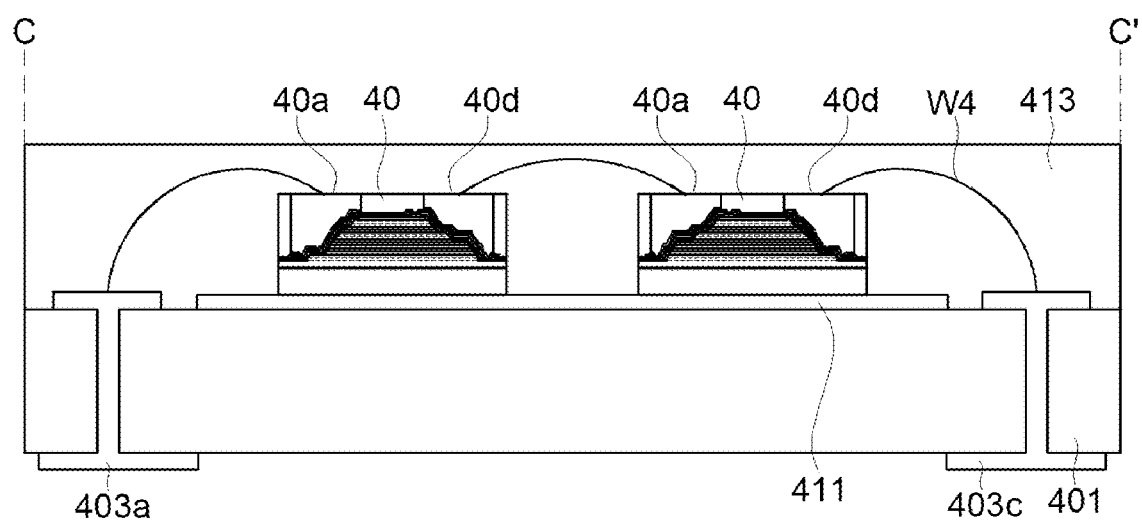
FIG. 5B is a schematic cross-sectional view taken along line C-C' of FIG. 5A.

FIG. 5A and FIG. 5B are a schematic plan view and a schematic cross-sectional view illustrating a light emitting device module 400 according to another exemplary embodiment, respectively.

Referring to FIGS. 5A and 5B, the light emitting device module 400 may be formed in the same manner as in FIGS. 2A and 2B except for first, second, third, and fourth outer electrodes 403a, 403b, 403c, and 403d and a light emitting device 40. The light emitting device module 400 may include four light emitting devices 40 arranged on a substrate 401, and the first, second, third and fourth outer electrodes 403a, 403b, 403c, and 403d may be disposed along four side surfaces of the substrate 401. The first, second, and, third outer electrodes 403a, 403b, and 403c may be formed at least as many as the number of the light emitting devices 40, and the first, second, and third outer electrodes 403a, 403b, and 403c may be spaced apart from one another. In the illustrated exemplary embodiment, the first, second, and third outer electrodes 403a, 403b, and 403c may be formed at the same interval and in the same shape, but the inventive concepts are not limited thereto. The first, second, and third outer electrodes 403a, 403b, and 403c may be formed to have various intervals and shapes depending on arrangements of the light emitting devices 40.

An adhesive layer 411 may be interposed between the substrate 401 and the plurality of light emitting devices 40.

Power may be supplied to the light emitting device 40 through the first, second, third, and fourth outer electrodes 403a, 403b, 403c, and 403d. For example, the first, second, and third outer electrodes 403a, 403b, and 403c may be connected to a p-type semiconductor layer of each LED stack of the light emitting device 40 by bonding wires W4, and the fourth outer electrode 403d may be commonly connected to n-type semiconductor layers of the four light emitting devices 40 to supply power. The bonding wires W4 may be bonded in various directions depending on the arrangements of the first, second, third, and fourth outer electrodes 403a, 403b, 403c, and 403d and the light emitting device 40. For example, the light emitting device 40 may include a first bump pad 40a, a second bump pad 40b, a third bump pad 40c, and a fourth bump pad 40d. The first bump pad 40a may be electrically connected to the first outer electrode 403a, the second bump pad 40b may be electrically connected to the second outer electrode 403b, and the third bump pad 40c may be electrically connected to the third outer electrode 403c. In addition, the fourth bump pad 40d may be electrically connected to the fourth bump pad 40d of an adjacent light emitting device, and finally connected to the fourth outer electrode 403d to receive power.

In the illustrated exemplary embodiment, the light emitting device 40 includes four light emitting devices 40, but the inventive concepts are not limited thereto, and may include at least one light emitting device 40. In addition, the number of outer electrodes may be changed depending on the number of the light emitting devices 40 disposed.

In some forms, the light emitting device 40 may include a first LED stack, a second LED stack, and a third LED stack in which one pixel is stacked in a vertical direction. The first LED stack may emit light having a longer wavelength than those of the second and third LED stacks, and the second LED stack may emit light having a longer wavelength than that of the third LED stack. For example, the first LED stack may emit blue light, the second LED stack may emit green light, and the third LED stack may emit red light.

The first bump pad 40a, the second bump pad 40b, the third bump pad 40c, and the fourth bump pad 40d are electrically connected to the first LED stack, the second LED stack, and the third LED.

Figure 6A:
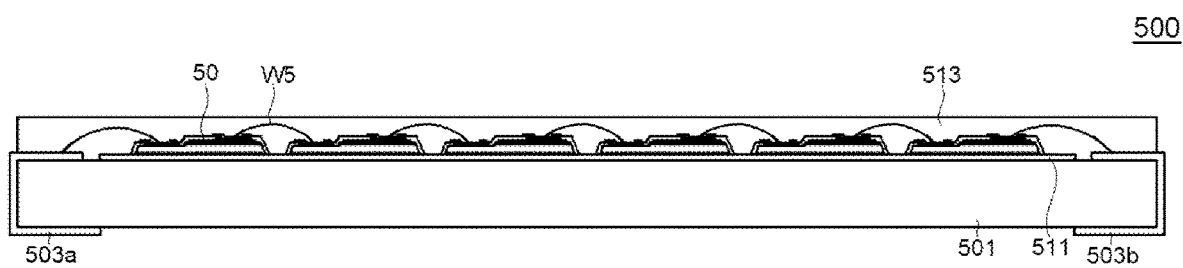
FIG. 6A is a schematic cross-sectional view illustrating a light emitting device module according to another exemplary embodiment.
Figure 6B:
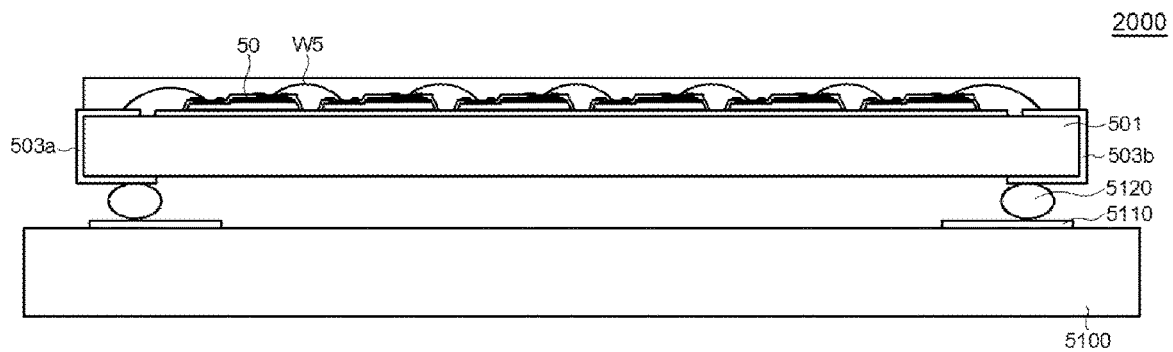
FIG. 6B is a schematic cross-sectional view illustrating a display apparatus according to another exemplary embodiment.

FIG. 6A is a schematic cross-sectional view illustrating a light emitting device module 500 according to another exemplary embodiment, and FIG. 6B is a schematic cross-sectional view illustrating a display apparatus 2000 to which the light emitting device module 500 of FIG. 6A is applied.

Referring to FIG. 6A, the light emitting device module 500 may be formed in the same manner as in FIG. 2B except for first and second outer electrodes 503a and 503b. The first and second outer electrodes 503a and 503b may be formed to cover a side surface of a substrate 501. More specifically, the first and second outer electrodes 503a and 503b may be formed on at least portions of upper and lower surfaces of the substrate 501, and may connect portions of the first and second outer electrodes 503a and 503b formed on the upper and lower surfaces of the substrate 501 and be formed to cover side surfaces of the substrate 501.

An adhesive layer 511 may be interposed between the substrate 501 and the plurality of light emitting devices 50.

In the illustrated exemplary embodiment, the first outer electrode 503a may be connected to p-type semiconductor layers of the plurality of light emitting devices 50 by bonding wires W5, and the second outer electrode 503b may be connected to n-type semiconductor layers thereof, but the inventive concepts are not limited thereto.

Referring to FIG. 6B, the light emitting device module 500 may be formed on a panel substrate 5100 in the same manner as in FIG. 1B. A bonding agent 5120 may be interposed between a pad 5110 on an upper surface of the panel substrate 5100 and the first and second outer electrodes 503a and 503b of the substrate 501, and the pad 5110 and the first and second outer electrodes 503a and 503b may be bonded by the bonding agent 5120. More particularly, the pads 5110 on the panel substrate 5100 and the first and second outer electrodes 503a and 503b may be bonded in contact with the bonding agents 5120. The bonding agent 5120 may be a solder ball, and the substrate 501 may be bonded through a ball grid array (BGA). However, the inventive concepts are not limited thereto, and may be connected by soldering, epoxy bonding, and anisotropic conductive film (ACF) bonding.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

What is claimed is:

1. A light emitting device module, comprising:
a substrate comprising a mounting region and an outer region;
a plurality of light emitting devices mounted on the mounting region of the substrate;
at least one adhesive layer interposed between the mounting region of the substrate and the plurality of light emitting devices, the at least one adhesive layer having a first non-conductive material;
an outer electrode arranged in the outer region of the substrate, the outer region being external to the mounting region in the substrate; and
one or more bonding wires electrically connecting the plurality of light emitting devices to the outer electrode.

2. The light emitting device module of claim 1, wherein the substrate is formed of a second non-conductive material.

3. The light emitting device module of claim 1, wherein the plurality of light emitting devices emit light of different wavelengths from one another.

4. The light emitting device module of claim 3, wherein the plurality of light emitting devices emit blue light, green light, and red light, respectively.

5. The light emitting device module of claim 3, wherein:
the plurality of light emitting devices includes a first LED stack, a second LED stack, and a third LED stack, and
the first, second, and third LED stacks emit red light, blue light, and green light, respectively.

6. The light emitting device module of claim 5, wherein the substrate includes at least four outer electrodes.

7. The light emitting device module of claim 3, wherein the light emitting devices are arranged in a matrix form on the substrate.

8. The light emitting device module of claim 3, wherein the light emitting devices are arranged in a zigzag form on the substrate.

9. The light emitting device module of claim 1, wherein the substrate includes at least two outer electrodes.

10. The light emitting device module of claim 9, wherein the outer electrodes are arranged at an edge of the substrate and formed to cover a side surface of the substrate.

11. The light emitting device module of claim 9, wherein:
the outer electrodes include a first outer electrode and a second outer electrode,
the first outer electrode is disposed adjacent to and parallel to one side surface of the substrate, and
the second outer electrode faces the first outer electrode and is disposed adjacent to another side surface of the substrate, wherein another side surface of the substrate is opposite to one side surface of the substrate.

12. The light emitting device module of claim 11, wherein the first outer electrode is connected to one or more anode electrodes of the light emitting devices, and the second outer electrode is commonly connected to one or more cathode electrodes of the light emitting devices; and further comprising a control unit coupled to the light emitting devices, the first outer electrode and the second outer electrode and operable to drive the light emitting devices.

13. The light emitting device module of claim 1, wherein one of the one or more bonding wires electrically connects two light emitting devices such that power is supplied to one of the two light emitting devices via an electrical connection from the other light emitting device to the outer electrode; and the bonding wires are formed of a metallic material.

14. The light emitting device module of claim 1, wherein the outer electrode is formed passing through the substrate.

15. The light emitting device module of claim 1, further comprising: a molding layer surrounding the light emitting devices.

16. A display apparatus, comprising:
a panel substrate; and
a plurality of light emitting device modules arranged on the panel substrate, each of the light emitting device modules, comprising:
a module substrate comprising a mounting region and an outer region, wherein the module substrate is formed of a first non-conductive material;
a plurality of light emitting devices mounted on the mounting region of the module substrate;
at least one adhesive layer interposed between the mounting region of the module substrate and the plurality of light emitting devices;
an outer electrode in at least the outer region of the module substrate which is external to the mounting region; and
one or more bonding wires electrically connecting the plurality of light emitting devices to the outer electrode.

17. The display apparatus of claim 16, wherein the panel substrate and the outer electrode are bonded with a bonding agent.

18. The display apparatus of claim 16, wherein one bonding wire of the one or more bonding wires electrically connects two light emitting devices; and the bonding wire is formed of a conductive material.

19. The display apparatus of claim 16, wherein the outer electrode further comprises a plurality of outer electrodes spaced apart from one another; and a number of the outer electrodes is equal to, or greater than a number of the light emitting devices included in each light emitting device module.

20. The display apparatus of claim 19, wherein the outer electrode further comprises a power electrode and at least three outer electrodes; the power electrode is commonly connected to n-type semiconductor layers of the light emitting devices; and the at least three outer electrodes are connected to a p-type semiconductor layer of the light emitting devices.

* * * * *